(12) United States Patent
Schatz

(10) Patent No.: US 11,581,245 B2
(45) Date of Patent: Feb. 14, 2023

(54) POWER ELECTRONIC SWITCHING DEVICE WITH A THREE-DIMENSIONALLY PREFORMED INSULATION MOLDING AND A METHOD FOR ITS MANUFACTURE

(71) Applicant: SEMIKRON ELEKTRONIK GMBH & CO. KG, Nuremberg (DE)

(72) Inventor: Michael Schatz, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 1 day.

(21) Appl. No.: 17/408,090

(22) Filed: Aug. 20, 2021

(65) Prior Publication Data

US 2022/0068768 A1    Mar. 3, 2022

(30) Foreign Application Priority Data

Sep. 1, 2020   (DE) .................... 10 2020 122 784.1

(51) Int. Cl.
| | | |
|---|---|---|
| H01L 23/31 | (2006.01) | |
| H01L 23/485 | (2006.01) | |
| H01L 21/48 | (2006.01) | |
| H01L 23/482 | (2006.01) | |

(52) U.S. Cl.
CPC ...... H01L 23/4855 (2013.01); H01L 21/4814 (2013.01); H01L 23/4827 (2013.01)

(58) Field of Classification Search
CPC ............................ H01L 23/31; H01L 23/3157
See application file for complete search history.

(56) References Cited

U.S. PATENT DOCUMENTS

2007/0045745 A1\*   3/2007   Ewe ........................ H01L 24/82
257/E23.092

FOREIGN PATENT DOCUMENTS

DE       102015116165 A1     3/2017

\* cited by examiner

*Primary Examiner* — Jae Lee
(74) *Attorney, Agent, or Firm* — Andrew F. Young; Nolte Lackenbach Siegel

(57) ABSTRACT

A power electronic switching device has a substrate facing in a normal direction with a first and a second conductive track, and a power semiconductor component is arranged on the first conductive track by an electrically conductive connection. The power semiconductor component has a laterally surrounding edge and an edge region and a contact region on its first primary side facing away from the substrate, and with a three-dimensionally preformed insulation molding that has an overlap segment, a connection segment and an extension segment, wherein the overlap segment, starting from the edge partially overlaps the edge region of the power semiconductor component.

11 Claims, 4 Drawing Sheets

POWER ELECTRONIC SWITCHING DEVICE WITH A THREE-DIMENSIONALLY PREFORMED INSULATION MOLDING AND A METHOD FOR ITS MANUFACTURE

CROSS REFERENCE TO RELATED APPLICATIONS

This application relates to and claims priority to DE 10 2020 122 784.1 filed Sep. 1, 2020, the entire contents of which are incorporated herein fully by reference.

FIGURE SELECTED FOR PUBLICATION

FIG. 3

BACKGROUND OF THE INVENTION

Field of the Invention

The invention describes a power electronic switching device having a substrate with a first and a second conductive track, wherein a power semiconductor component is arranged on the first conductive track by means of an electrically conductive connection. The power semiconductor component comprises a laterally surrounding edge and an edge region against which an insulation device is arranged. The invention furthermore describes a method for the manufacture of a power electronic switching device of this sort.

Description of the Related Art

DE 10 2015 116 165 A1 discloses a method for the manufacture of a power electronic switching device as the prior art. A power semiconductor component is arranged here on a first region of a conductive track of a substrate. An insulating film with a cutout is subsequently prepared, wherein an overlap region of the insulating film adjacent to this cutout is designed to cover an edge region of the power semiconductor component. The arrangement of the insulating film on the substrate with the power semiconductor component arranged thereon follows in such a way that the edge region of the power semiconductor component is covered on every side by the overlap region of the insulating film, wherein a further section of the insulating film covers parts of one of the conductive tracks. Finally, the connecting device is arranged.

ASPECTS AND SUMMARY OF THE INVENTION

In the light of the said prior art, the invention is based on the object of presenting a power electronic switching device and a method for its manufacture with an alternative insulation device, wherein this can be arranged more easily and the material of which is technically advantageous.

This object is achieved according to the invention by a power electronic switching device with a substrate facing in a normal direction with a first and a second conductive track, wherein a power semiconductor component is arranged by means of an electrically conductive connection on the first conductive track, wherein the power semiconductor component has a laterally surrounding edge and has an edge region and a contact region on its first primary side facing away from the substrate, and with a three-dimensionally preformed insulation molding comprising an overlap segment, a connection segment and an extension segment, wherein the overlap segment, starting from the edge, partially overlaps the edge region of the power semiconductor component, viewed from the normal direction, in two directions each perpendicular to this normal direction, whereby the contact region is partially or completely not overlapped by the insulation molding, and is thus left exposed and accessible.

It can in particular be advantageous if the overlap segment, viewed from the normal direction, starting from the edge, overlaps the edge region completely and the contact region partially, preferably fully surrounding, and to the least possible extent.

It can be preferable if the insulation molding has a contoured profile on its second primary side facing towards the substrate, and preferably also has a contoured profile on its first primary side facing away from the substrate. It can here furthermore be preferred if the thickness of the insulation molding is not homogeneous, and in a first planar segment is more than 20%, preferably more than 30%, particularly preferably more than 50% less than in a second planar segment. A planar segment is here intended to refer to a segment with two segments of the respective primary side that are parallel to one another. The first planar segment preferably lies in the region of the connection segment, and the second planar segment in the region of the extension segment.

It can be particularly advantageous if a first adhesive substance is disposed between the overlap segment and the first primary side of the power semiconductor component. It can here furthermore be advantageous if the first adhesive substance is also disposed between the edge of the power semiconductor component and an associated region of the connection segment.

It can furthermore be preferable if the connection segment rests directly on the first conductive track, or if a second adhesive substance is disposed between an associated region of the connection segment and the first conductive track. It is particularly preferred here if the first and second adhesive substances are formed of the same material.

Advantageous embodiments emerge if the insulation molding has a dielectric constant that is 25%, preferably 50%, particularly preferably 100% greater than the first adhesive substance.

Further advantageous embodiments emerge if the insulation molding has a coefficient of thermal expansion that is 25%, preferably 50%, particularly preferably 100% less than the first adhesive substance.

Advantageous embodiments also emerge if the insulation molding has a dielectric strength of more than 1000 kV/m, in particular more than 2000 kV/m, and a resistivity of more than $10^9$ Ω/m, in particular of more than $10^{10}$ Ω/m.

Advantageous embodiments finally emerge if the insulation molding is formed of a material from the material group of liquid-crystal polymers or of thermoplastics or of thermosetting plastics. The insulation molding can, in particular, be formed of polyamide, polyamide imide, polyethylene terephthalate, polyphenylene sulfide or polyether ether ketone.

The object is further achieved by a method for the manufacture of a power electronic switching device according to the invention referred to above with the method steps of:

a) providing the substrate with a power semiconductor component arranged on and connected electrically conductively to a first conductive track; and b) arranging the three-dimensionally preformed insulation molding.

It can be advantageous here if the following method step is carried out before method step b): arranging a first adhesive substance on the edge region of the power semiconductor component or on a planar segment of the insulation molding that faces the edge region of the power semiconductor component.

It can also be preferred if the following method step is carried out after method step b): subjecting the power electronic switching device to a temperature between 50° C. and 200° C., preferably between 80° C. and 120° C.

It can further be preferred if the following method step is carried out after method step b): arranging a connecting device for electrically conductive connection between a contact surface of the contact segment of the power semiconductor component and the second conductive track, wherein the connecting device is designed as a wire bond connection or as a film stack, wherein this is formed of an alternating arrangement of at least one electrically conductive film and at least one electrically insulating film.

Of course, provided this is neither excluded per se nor explicitly, the features, in particular the respective conductive tracks and the power semiconductor component and, if relevant, also the insulation molding, referred to in the singular, can also be present multiple times in the power electronic switching device according to the invention. It can, however, also be preferable if only precisely one three-dimensionally preformed insulation molding is present in the power electronic switching device according to the invention.

It should be clear that the various embodiments of the invention can be released individually or in any desired combinations in order to achieve improvements. In particular, the features referred to and explained above and below, regardless of whether they are described in the context of the power electronic switching device or of the method, can be utilized not only in the given combinations but also in other combinations or alone, without leaving the scope of the present invention. In a preferred manner, only one or at most two three-dimensionally preformed insulation moldings are arranged, and at least two, preferably more than two, power semiconductor components are assigned to each.

The above and other aspects, features, objects, and advantages of the present invention will become apparent from the following description read in conjunction with the accompanying drawings, in which like reference numerals designate the same elements.

BRIEF DESCRIPTION OF THE DRAWINGS

Further explanations of the invention, advantageous details and features, emerge from the following description of the exemplary embodiments of the invention illustrated schematically in FIGS. 1 to 7, or of respective parts thereof. A power electronic switching device according to the invention should here always be understood to also refer to a power electronic switching device manufactured according to the invention.

For the purpose of further explanation.

DETAILED DESCRIPTION OF THE PREFERRED EMBODIMENTS

Figure 1:
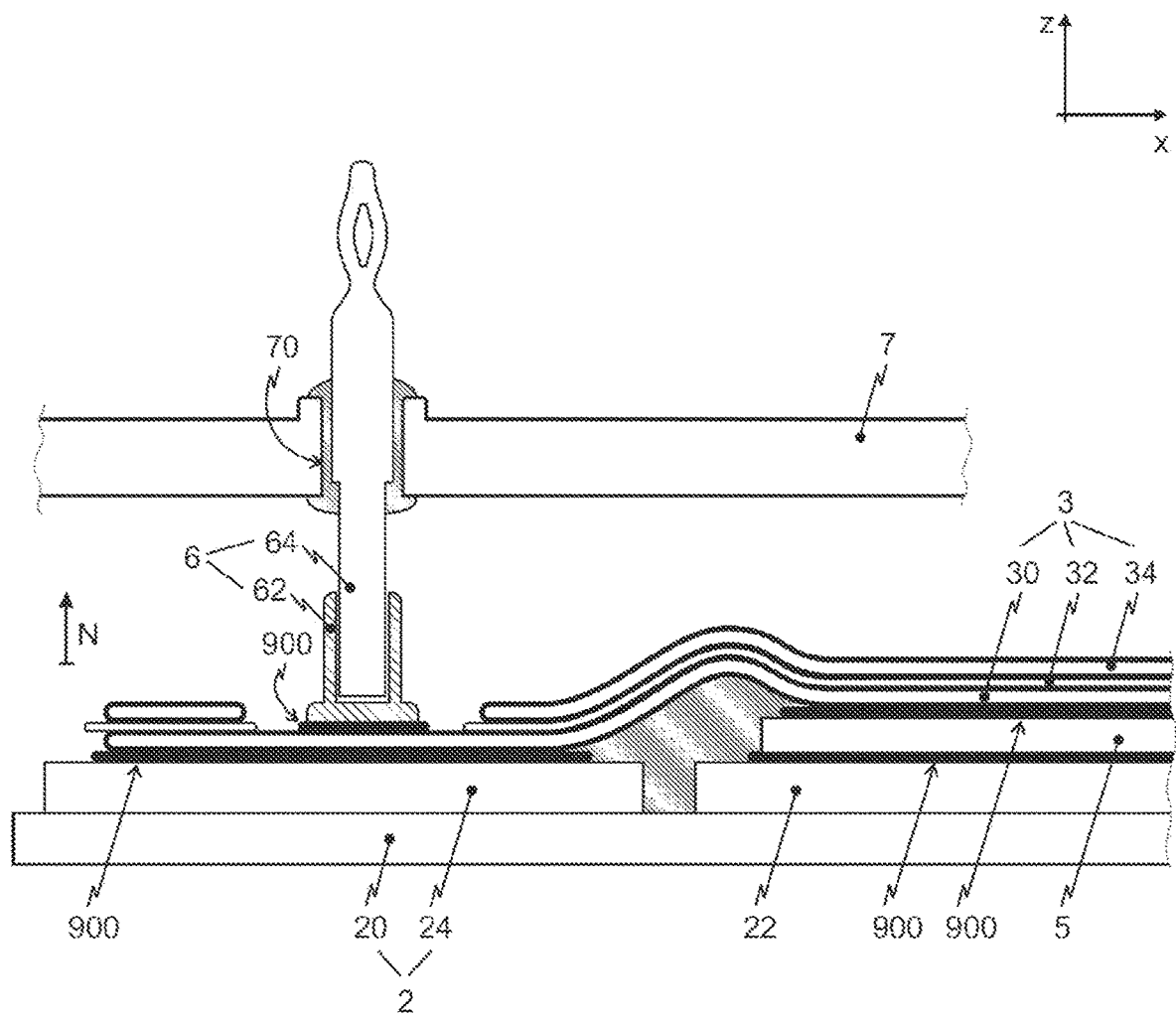
FIG. 1 shows a side view of a power electronic switching device according to the prior art.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a side view of a power electronic switching device 1 according to the prior art. This switching device 1 comprises a substrate 2 with a body 20 of insulating material and first and second conductive tracks 22, 24 arranged here. A power semiconductor component 5 is arranged on the first conductive track 22 of this substrate 2, and is electrically conductively connected to this with its contact surface facing the first conductive track 22. This electrically conductive connection 900 is formed here, without restricting generality, as a pressure-sintered material bond.

The power semiconductor component 5, or, more precisely, its contact surface facing away in the normal direction N thereof from the substrate 2, is electrically conductively connected to a second conductive track 24 of the substrate 2 by means of a connecting device 3. This connecting device 3 is designed as a film laminate consisting of a first electrically conductive film 30 facing towards the substrate 2, an electrically insulating film 32 following in the film laminate, and a second electrically conductive film 34 again following in the film laminate. Advantageously at least one electrically conductive film 30, 34 is here structured in itself, and forms conductive film tracks.

The power electronic switching device 1 further comprises a connecting element 6, only an auxiliary connecting element being illustrated here, to carry auxiliary potentials such as, for example, sensor or control signals. This connecting element 6 is designed as a conventional press-contact element 64, arranged on the connecting device by means of a sleeve 62. This sleeve comprises a material bond 900 to a contact segment on the surface of the first electrically conductive film 30 that faces away from the substrate 2.

This first electrically conductive film 30 is connected to the second conductive track 24 of the substrate 2 by means of a materially bonded, electrically conductive connection 900, here formed as a conventional pressure-sintered connection. A part of a housing 7, which here is part of the power electronic switching device or of a power semiconductor module formed therewith, is also illustrated. This housing comprises a feed-through 70 for the connecting element 6. Such internal connecting devices, connecting elements and housings or partial housings, including those of different design, referred to here can also be arranged against the power electronic switching device according to the invention, and then, in particular, form a power semiconductor submodule with it.

Figure 2:
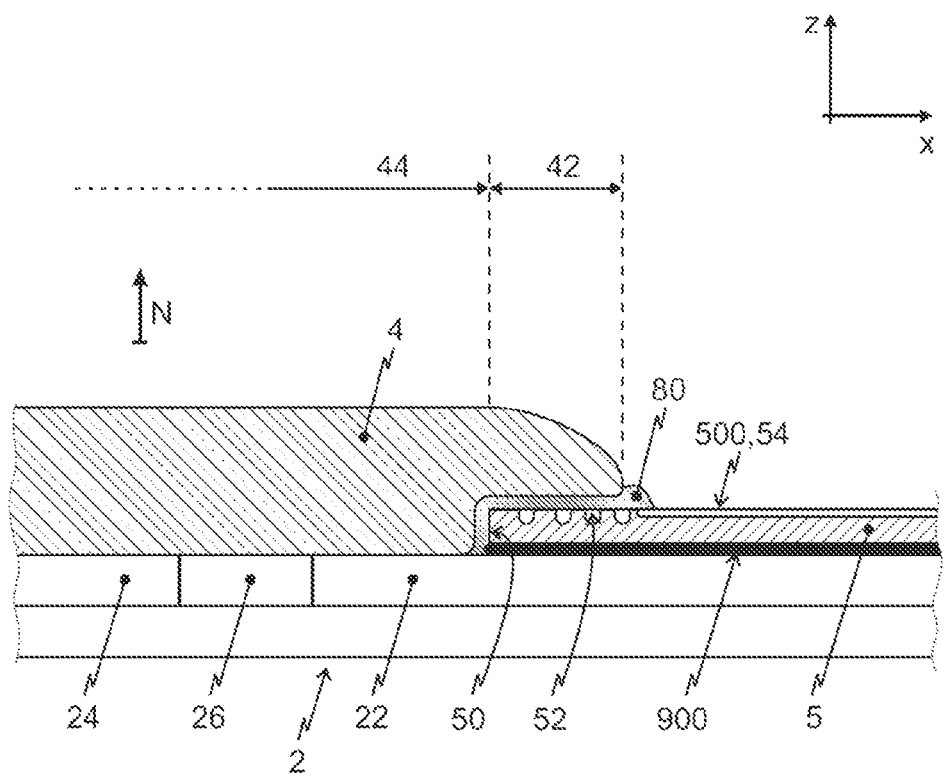
FIGS. 2 and 3 show a side view of a first embodiment of a power electronic switching device according to the invention.
Figure 3:
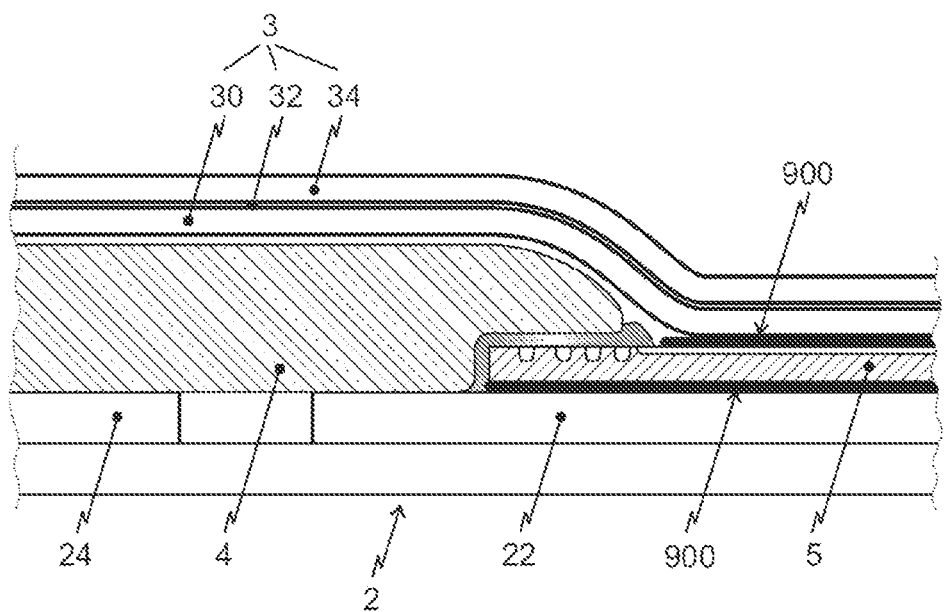

FIGS. 2 and 3 show a side view of a first embodiment of a power electronic switching device according to the invention. The substrate 2, together with the power semiconductor component 5, as well as the fundamental design of the connecting device 3 according to FIG. 3, correspond to the prior art, as is described under FIG. 1. This connecting device 3, designed as a film laminate, comprises a first and second electrically conductive film 30, 34, each having a thickness of 200 µm, and an electrically insulating film 32, with a thickness of 80 µm.

Figure 7:
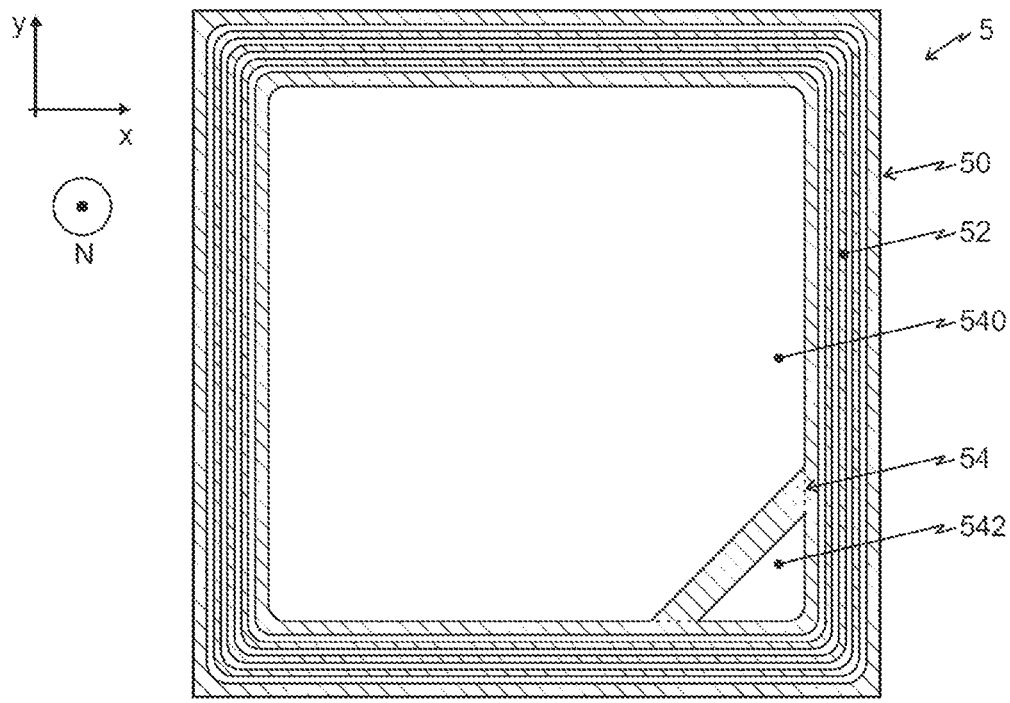
FIG. 7 shows a plan view of a power semiconductor component of a power electronic switching device.

The power semiconductor component 5 comprises (cf. also FIG. 7) a laterally surrounding edge 50 and, on its first primary side 500 that faces away from the substrate 2, an edge region 52 and a contact region 54 that is immediately adjacent to the edge region 52 and one or, as illustrated in FIG. 7, a plurality of contact surfaces.

A part of a three-dimensionally preformed insulation molding 4, which is rigid in design in comparison with a film, is furthermore illustrated. This insulation molding 4 comprises an overlap segment 42, a connection segment 44 and an extension segment 46, not illustrated here, wherein the connection segment 44 is arranged entirely between the overlap segment 42 and the extension segment 46. Viewed from the normal direction N, the overlap segment 42, starting from the edge 50 of the power semiconductor component 5, partially overlaps the edge region 52 of the power semiconductor component 5, and extends here close up to the contact region 54.

A first adhesive substance 80 is disposed between the overlap segment 42 and the first primary side 500 of the power semiconductor component 5, or, more precisely, the overlapped segment of the edge region 52 of the power semiconductor component 5. This first adhesive substance 80 is also disposed between the edge of the power semiconductor component 5 and the opposite, i.e., associated, region of the connection segment 44 of the insulation molding 4, so that there is no direct contact between the three-dimensionally preformed insulation molding 4 and the power semiconductor component 5. The first adhesive substance 80 even extends over the edge of the insulation molding 4 in the direction of the contact region 54 of the power semiconductor component 5, and touches this region to a slight extent.

Moreover, in this embodiment, the connection segment 44 rests directly on the first as well as the second conductive track 22, 24, and thereby bridges a trench 26 disposed between the conductive tracks 22, 24.

In this exemplary embodiment, the insulation molding 4 consists, purely by way of example, of polyphenylene sulphide, and has a dielectric constant that is at least 50% greater than that of the first adhesive substance 80, which is a silicone rubber. The insulation molding 4 moreover has a coefficient of thermal expansion that is at least 50% less than the first adhesive substance 80. The insulation molding 4 furthermore has a dielectric strength of more than 1500 kV/m, and a resistivity of more than 1010 Ω/m.

Figure 4:
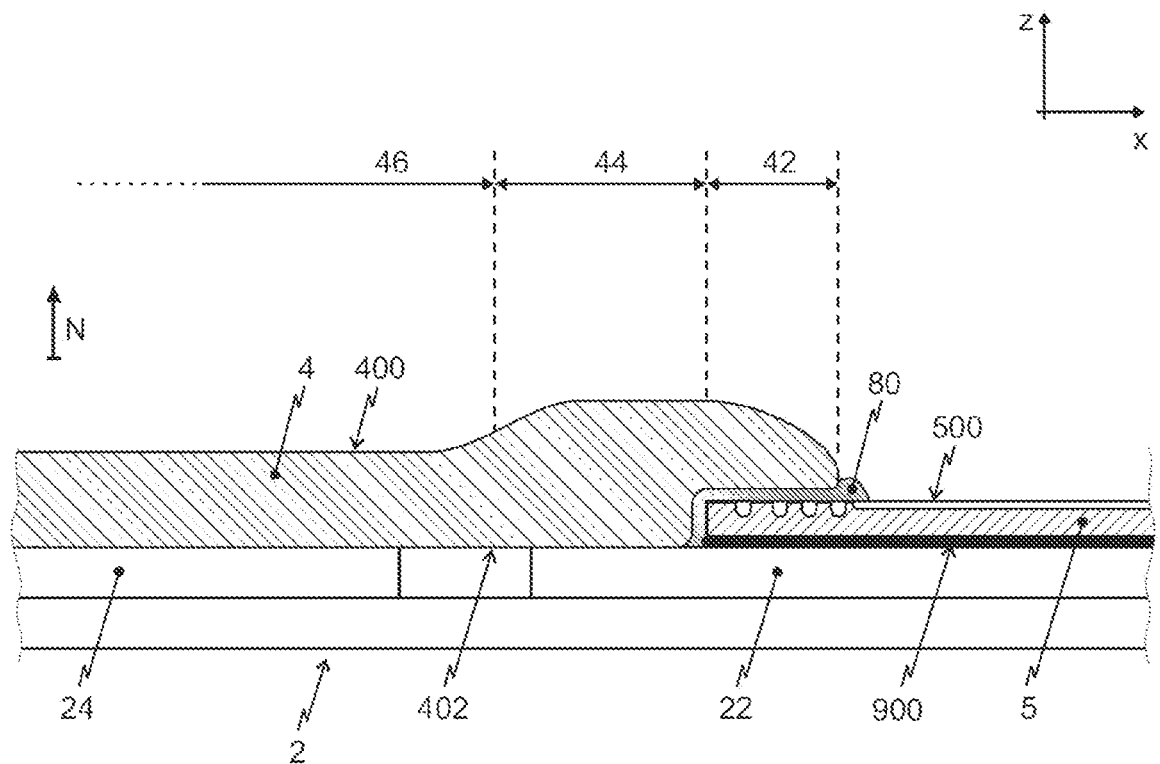
FIG. 4 shows a side view of a second embodiment of a power electronic switching device according to the invention.

FIG. 4 shows a side view of a second embodiment of a power electronic switching device according to the invention. The substrate 2, the power semiconductor component 5 and the first adhesive substance 80 are each identical to those according to FIGS. 2 and 3.

The overlap segment 42, the connection segment 44 and a part of the extension segment 46 of the three-dimensionally preformed insulation molding 4 are illustrated here. In this second embodiment, the insulation molding 4, like that of the first embodiment, has a contoured profile on its second primary side 402 that faces the substrate 2. In the region of the transition from the connection segment 44 to the extension segment 46, this three-dimensionally preformed insulation molding 4 also has a contoured profile on its first primary side 400 that faces away from the substrate 2.

The connection segment 44, as well as the extension segment 46 that extends to a further connection segment, not illustrated, of a further power semiconductor component, also not illustrated, also rests in this second embodiment directly on the first and second conductive tracks 22, 24.

Figure 5:
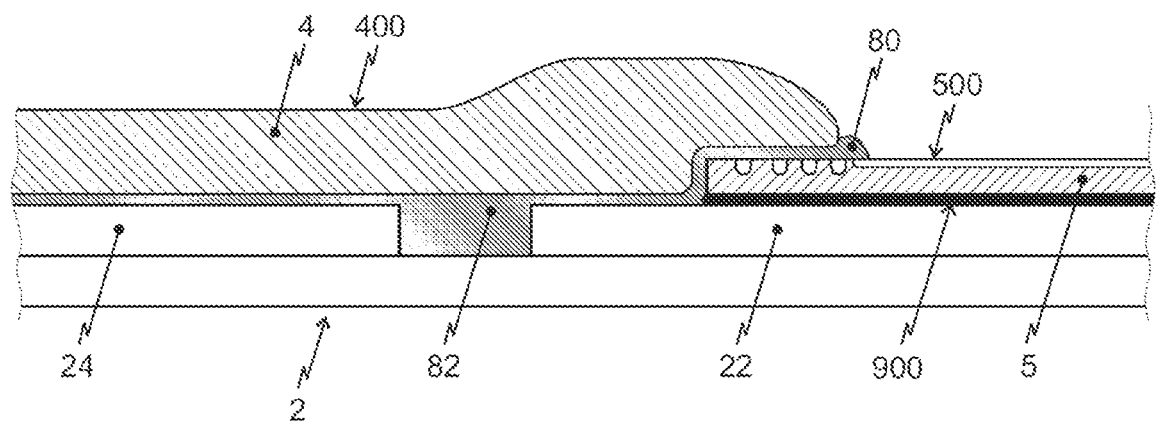
FIG. 5 shows a side view of a third embodiment of a power electronic switching device according to the invention.

FIG. 5 shows a side view of a third embodiment of a power electronic switching device according to the invention. In contrast to the second embodiment, the connection segment 44, and also the extension segment 46, do not lie directly on either of the conductive tracks 22, 24 here. Instead, a second adhesive substance 82 is in this case disposed over the entire surface between the three-dimensionally preformed insulation molding 4 and the substrate 2, including its conductive tracks 22, 24. The first and second adhesive substances 80, 82 are advantageously formed of the same material, i.e., are identical, and are also disposed simultaneously in the course of the manufacturing method.

Figure 6:
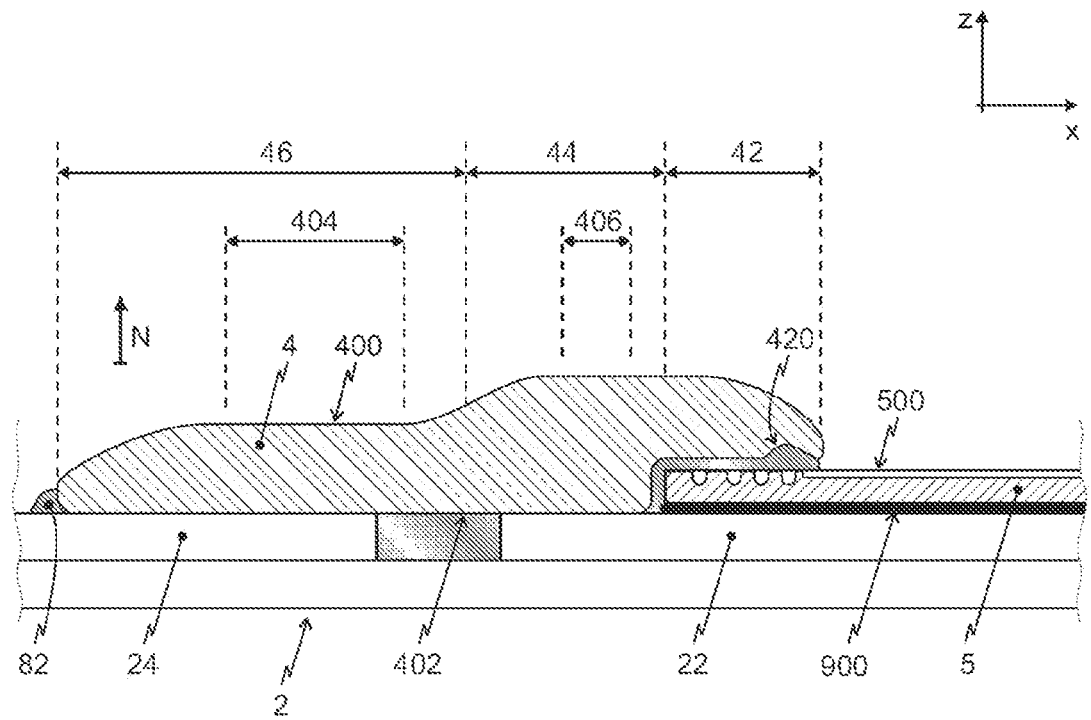
FIG. 6 shows a side view of a fourth embodiment of a power electronic switching device according to the invention.

FIG. 6 shows a side view of a fourth embodiment of a power electronic switching device according to the invention. The three-dimensionally preformed insulation molding 4 here again comprises an overlap segment 42, a connection segment 44 and an extension segment 46. Viewed from the normal direction N, the overlap segment 42 here, starting from the edge 50, overlaps the edge region 52 of the power semiconductor component entirely, and thereby also fully surrounding, as well as, partially, the contact region 54 of the power semiconductor component 5, although only to a small extent.

The edge of the overlap segment 42 comprises a fully surrounding channel-like recess 420, disposed facing the power semiconductor component 5, for secure mechanical connection.

The insulation molding 4 has a contoured profile on its second primary side 402 facing the substrate 2. It also has a contoured profile on its first primary side 400, facing away from the substrate 2. The thickness of the insulation molding 4 is thus non-homogeneous, and is more than 30% less in a first planar segment 404 than in a second planar segment 406.

For the purpose of further explanation, FIG. 7 shows a plan view of a power semiconductor component 5 of a power electronic switching device. The power semiconductor component 5 has an edge 50 located at the side between its primary surfaces. On the top side, which is the first primary side 500, cf. FIGS. 2 to 6, an edge region 52 of this first primary side 500 extends, starting from the edge 50, in which annular edge structures, customary in the art, are arranged. The contact region 54 is arranged adjacent to the edge region 52, forming the inner region of the power semiconductor component 5, and encloses all the electrical contact surfaces 540, 542 as well as their intermediate spaces. Shown here, purely by way of example, are two electrical contact surfaces, a control connection contact surface 542 and a load connection contact surface 540, embodied here as an emitter connection contact surface of a power transistor.

It is recognized that the phrase moulding (English base) and molding (US base) have similar meanings in this technology.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic switching device (1), comprising:
    a substrate (2) facing in a normal direction (N) with a first and a second conductive track (22, 24);
    a power semiconductor component (5) arranged on the first conductive track (22) by means of an electrically conductive connection (900);
    the power semiconductor component (5) further comprising:
        a laterally surrounding edge (50) and an edge region (52) and a contact region (54) on its first primary side (500) facing away from the substrate (2);
        a three-dimensionally preformed insulation molding (4) includes an overlap segment (42), a connection segment (44) and an extension segment (46);
        the overlap segment (42) as seen from the normal direction (N) and starting from the edge (50) partially overlaps the edge region (52) of the power semiconductor component (5);
    wherein the overlap segment (42), as seen from the normal direction (N), starting from the edge (50) completely covers the edge region (52) and partially covers the contact region (54);
    wherein the insulation molding (4) has a contoured profile on a second primary side (402) facing towards the substrate (2);
    wherein said first primary side (400) of said insulation molding (4) has a contoured profile facing away from the substrate (2);
    a thickness of the insulation molding (4) is not homogeneous;
    said insulation molding (4), in a first planar segment (404), is 20% less than in a second planar segment (406); and
    wherein a first adhesive substance (80) is disposed between the overlap segment (42) and the first primary side (500) of the power semiconductor component (5).

2. The power electronic switching, device according to claim 1 wherein:
    the first adhesive substance (80) is also disposed between the edge (50) of the power semiconductor component (5) and an associated region of the connection segment (44).

3. The power electronic switching device, according to wherein:
    the connection segment (44) rests in at least one of directly on the first conductive track (22) and upon a second adhesive substance (82) disposed between an associated region of the connection segment (44) and the first conductive track (22).

4. The power electronic switching device, according to claim 3, wherein:
    the first and second adhesive substances (80, 82) are formed of the same material.

5. The power electronic switching device, according to claim 3, wherein:
    the insulation molding (4) has a dielectric constant that is at least 25% greater than a dielectric constant of said first adhesive substance (80).

6. The power electronic switching device, according to claim 3, wherein:
    the insulation molding (4) has a coefficient of thermal expansion that is at least 25% less than the first adhesive substance (80).

7. The power electronic switching device, according to claim 3, wherein:
    the insulation molding (4) has a dielectric strength of more than 1000 kV/m and a resistivity of more than $10^9$ Ω/m.

8. The power electronic switching device, according to claim 3, wherein:
    the insulation molding (4) is formed of a material from the material group of liquid-crystal polymers, of thermoplastics, and of thermosetting plastics.

9. A method for the manufacture of a power electronic switching device, comprising the steps of:
    a) providing a power electronic switching device, further comprising:
        a substrate (2) facing in a normal direction (N) with a first and a second conductive track (22, 24);
        a power semiconductor component (5) arranged on the first conductive track (22) by means of an electrically conductive connection (900);
        the power semiconductor component (5) further comprising:
            a laterally surrounding edge (50) and an edge region (52) and a contact region (54) on its first primary side (500) facing away from the substrate (2);
            a three-dimensionally preformed insulation molding (4) includes an overlap segment (42), a connection segment (44) and an extension segment (46);
        the overlap segment (42) as seen from the normal direction (N) and starting from the edge (50) partially overlaps the edge region (52) of the power semiconductor component (5);
        wherein the substrate (2) with the power semiconductor component (5) is arranged on and connected electrically conductively to the first conductive track (22);
    b) arranging the three-dimensionally preformed insulation molding (4); and
    wherein the following method step is carried out before method step b):
        arranging a first adhesive substance (80) on the edge region (52) of the power semiconductor component (5) or on a planar segment of the insulation molding (4) that faces the edge region (52) of the power semiconductor component (5).

10. The method, according to claim 9, wherein:
    the following method step is carried out after method step b):

subjecting the power electronic switching device to a temperature between 50° C. and 200° C.

11. The method, according to claim 10, wherein:

the following method step is carried out after method step b):

arranging a connecting device (3) for electrically conductive connection between an electrical contact surface (540, 542) of the contact region (54) of the power semiconductor component (5) and the second conductive track (24); and wherein the connecting device (3) is designed as one of a wire bond connection and a film stack formed of an alternating arrangement of at least one electrically conductive film (30, 34) and at least one electrically insulating film (32).

* * * * *